(12) United States Patent
Hayashida

(10) Patent No.: US 6,404,249 B2
(45) Date of Patent: *Jun. 11, 2002

(54) PHASE-LOCKED LOOP CIRCUIT AND FREQUENCY MODULATION METHOD USING THE SAME

(75) Inventor: Keiji Hayashida, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/484,941

(22) Filed: Jan. 18, 2000

(30) Foreign Application Priority Data

Jan. 18, 1999 (JP) .......................... 11-009876

(51) Int. Cl.[7] ................................ H03L 7/06
(52) U.S. Cl. ................. 327/159; 327/151; 327/160; 375/376; 331/DIG. 2
(58) Field of Search .................. 327/146, 147–151, 327/155–157, 159, 160, 115, 117; 375/373–376, 237; 331/11, 12, 17, 25, 40, DIG. 2, 1 A; 365/233, 233.5; 377/47–49

(56) References Cited

U.S. PATENT DOCUMENTS

| 4,916,403 | A | | 4/1990 | Sudoh et al. ............... 327/159 |
|---|---|---|---|---|
| 5,019,907 | A | | 5/1991 | Murakoshi et al. ......... 348/542 |
| 5,257,294 | A | * | 10/1993 | Pinto et al. ................. 375/376 |
| 5,488,627 | A | | 1/1996 | Hardin et al. ............... 375/139 |
| 5,703,537 | A | * | 12/1997 | Bland et al. ................ 331/1 A |
| 6,044,123 | A | * | 3/2000 | Takla ......................... 375/376 |

FOREIGN PATENT DOCUMENTS

| JP | 6-250755 | 9/1994 |
|---|---|---|
| JP | 7-235862 | 9/1995 |
| JP | 9-98152 | 4/1997 |
| JP | 9-289527 | 11/1997 |

OTHER PUBLICATIONS

Hoekstra, Cornelis D., "Frequency Modulation of System Clocks for EMI Reduction", Hewlett–Packard Journal, Aug. 1997, pp. 101–106.

* cited by examiner

Primary Examiner—Toan Tran
Assistant Examiner—Minh Nguyen
(74) Attorney, Agent, or Firm—Hutchins, Wheeler & Dittmar

(57) ABSTRACT

A phase-locked loop circuit includes with an oscillator which outputs a pulse signal, and a frequency divider for frequency-dividing the pulse signal. The frequency divider includes with a dividing factor switching circuit which switches the dividing factor before a phase of the pulse signal is locked to that of a reference clock signal.

9 Claims, 8 Drawing Sheets

PHASE-LOCKED LOOP CIRCUIT AND FREQUENCY MODULATION METHOD USING THE SAME

BACKGROUND OF THE INVENTION

1. Field of the Invention

The present invention relates to a phase-locked loop circuit to be used for frequency modulation in digital equipment, and a frequency modulation method using the same. In particular, the present invention relates to a phase-locked loop circuit with a reduced chip size, and a frequency modulation method using the same.

2. Description of the Related Art

Generally, phase-locked loops (PLLS) are in use to make the phase of oscillator's signals coincide with and follow the phase of a reference signal. On this account, the signals output from the oscillator are constant in phase. In such PLL circuits, however, problems resulting from electromagnetic interference (EMI) have been pointed out recently.

In this view, there has been disclosed reduction of EMI by changing the oscillated frequency to obtain modulation frequency in a PLL circuit (Japanese Patent Application Laid-Open Nos. Hei 9-289527 and Hei 6-250755). FIG. 1 is a block diagram showing a conventional PLL circuit.

A conventional PLL circuit comprises a phase and frequency detector (PFD) 52, a charge pump (CP) 53, a low-pass filter (LPF) 54, and a voltage-controlled oscillator (VCO) 55 in series connection. Besides, a loop counter 51 for frequency-dividing signals output from the voltage-controlled oscillator 55 is connected to an input terminal of the phase and frequency detector 52. A loop circuit is configured in this way. The phase and frequency detector 52 makes a comparison in phase between a reference frequency $f_r$ and the frequency of an output pulse of the loop counter 51, and outputs the phase difference to the charge pump 53. The charge pump 53 charges/discharges the capacitor provided in the low-pass filter 54 in accordance with a signal from the phase and frequency detector 52. The low-pass filter 54 separates the input signal for transmission. The voltage-controlled oscillator 55 oscillates pulse signals in association with a change in the output voltage from the low-pass filter 54.

The loop counter 51 is also connected with a ROM table 56, and this ROM table 56 is connected with an up/down counter 57. The ROM table 56 pre-stores dividing factors for use in frequency-dividing the output signal of the voltage-controlled oscillator 55. The up/down counter 57 changes the addressing in the ROM table 56 for each output of the loop counter 51.

In the conventional PLL circuit configured thus, the loop counter 51 outputs a pulse upon receiving a given number of pulse inputs that are output from the voltage-controlled oscillator 55. Each output from the loop counter 51 changes the value of the up/down counter 57, which in turn changes the address in the ROM table 56. This results in the dividing factor in the loop counter 51 being changed for each output. Accordingly, the signals output from the PLL circuit also vary in frequency for each output.

FIG. 2 is a graphical representation on which the abscissa represents time and the ordinate represents oscillated frequency, schematically showing variation in the oscillated frequency of the output signal from the conventional PLL circuit. For example, in the case where the dividing factor output from the ROM table 56 repeats a given period of ascent and a given period of descent, the oscillated frequency varies, as shown in FIG. 2, to obtain a so-called triangular waveform. Such variation of the oscillated frequency suppresses the EMI problems.

Incidentally, configuration such as shown in FIG. 1 is also described in U.S. Pat. No. 5,488,627.

However, conventional PLL circuits as described above require ROM tables, which produces a problem in that the circuits become greater in chip size or involve additional, dedicated chips. Besides, the modulation frequencies or ranges cannot be modified easily by reasons such that modifications to the modulation conditions inevitably require modifications to the ROM tables. Moreover, the ROM tables need to be provided with prescribed dividing factors in advance.

It is indeed possible to replace the ROM tables with RAMs; however, this brings about no solution to problems of increased chip size and the like.

SUMMARY OF THE INVENTION

An object of the present invention is to provide a phase-locked loop circuit which is capable of reduction in chip size and easy modification to its modulation conditions, and a frequency modification method using the same.

According to one aspect of the present invention, a phase-locked loop circuit comprises an oscillator which outputs a pulse signal and a frequency divider for frequency-dividing the aforesaid pulse signal. The frequency divider has a dividing factor switching circuit which switches a dividing factor before a phase of the aforesaid pulse signal is locked to that of a reference clock signal.

In the present invention, the dividing factor is switched by the dividing factor switching circuit before the phase of the pulse signal is locked to that of the reference clock signal, allowing more gentle variation in the oscillated frequency as compared with the case where the dividing factor is not switched until the lock in phase. Accordingly, it is possible to increase or decrease the oscillated frequency before its saturation. This provides a so-called triangle waveform without the use of storage device such as a ROM.

According to another aspect of the present invention, a frequency modulation method comprises the step of switching a dividing factor before a phase of a pulse signal output from an oscillator is locked to that of a reference clock signal.

In the present invention, the dividing factor is switched before the phase of the pulse signal is locked to that of the reference clock signal, allowing more gentle variation in the oscillated frequency as compared with the case where the dividing factor is not switched until the lock in phase. Accordingly, it is possible to increase or decrease the oscillated frequency before its saturation. This provides a so-called triangle waveform without the use of storages such as a ROM.

The nature, principle and utility of the invention will become more apparent from the following detailed description when read in conjunction with the accompanying drawings in which like parts are designated by like reference numerals or characters.

DETAILED DESCRIPTION OF THE PREFERRED EMBODIMENTS

Figure 1:
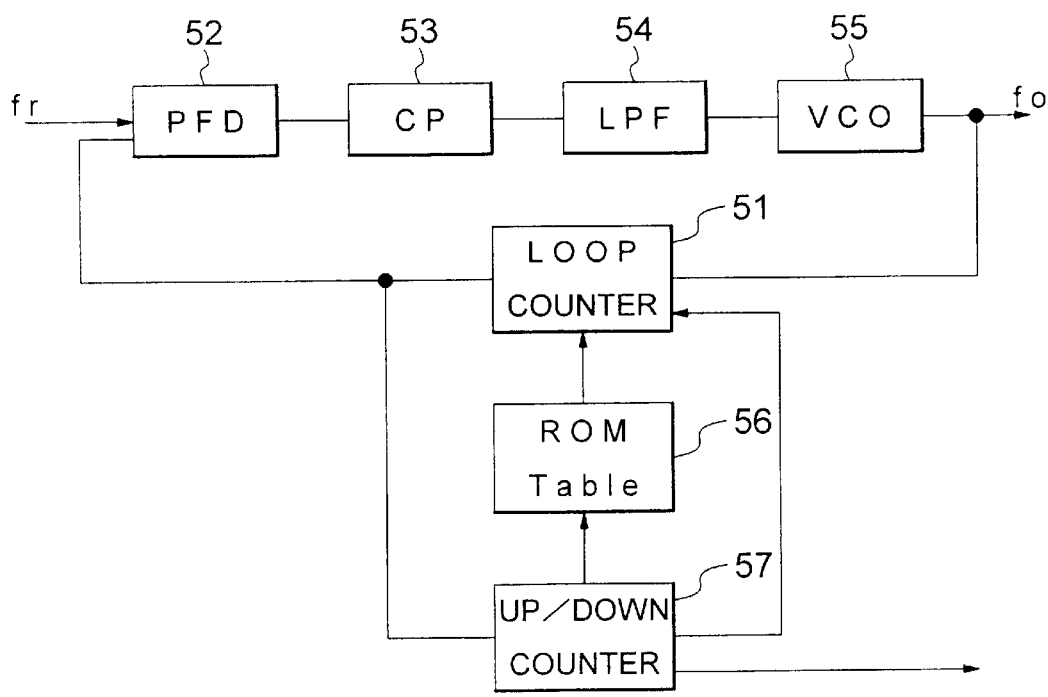
FIG. 1 is a block diagram showing a conventional PLL circuit.
Figure 2:
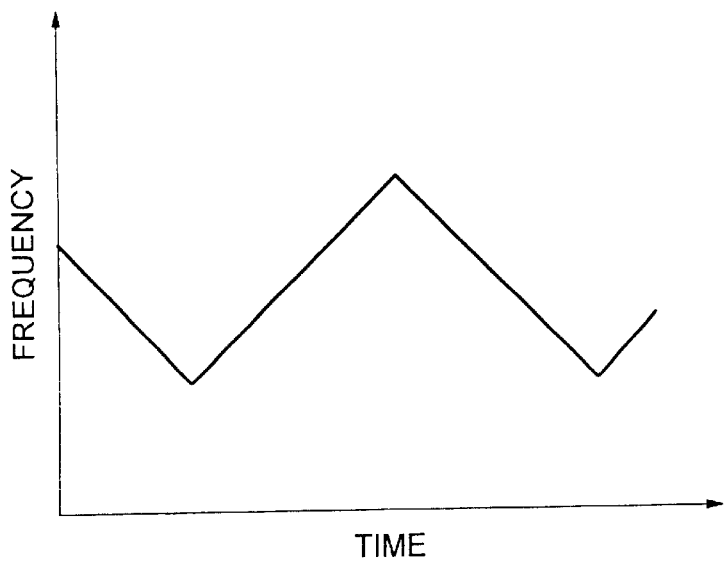
FIG. 2 is a graphical representation schematically showing variation in the oscillated frequency of the output signal in the conventional PLL circuit.
Figure 3:
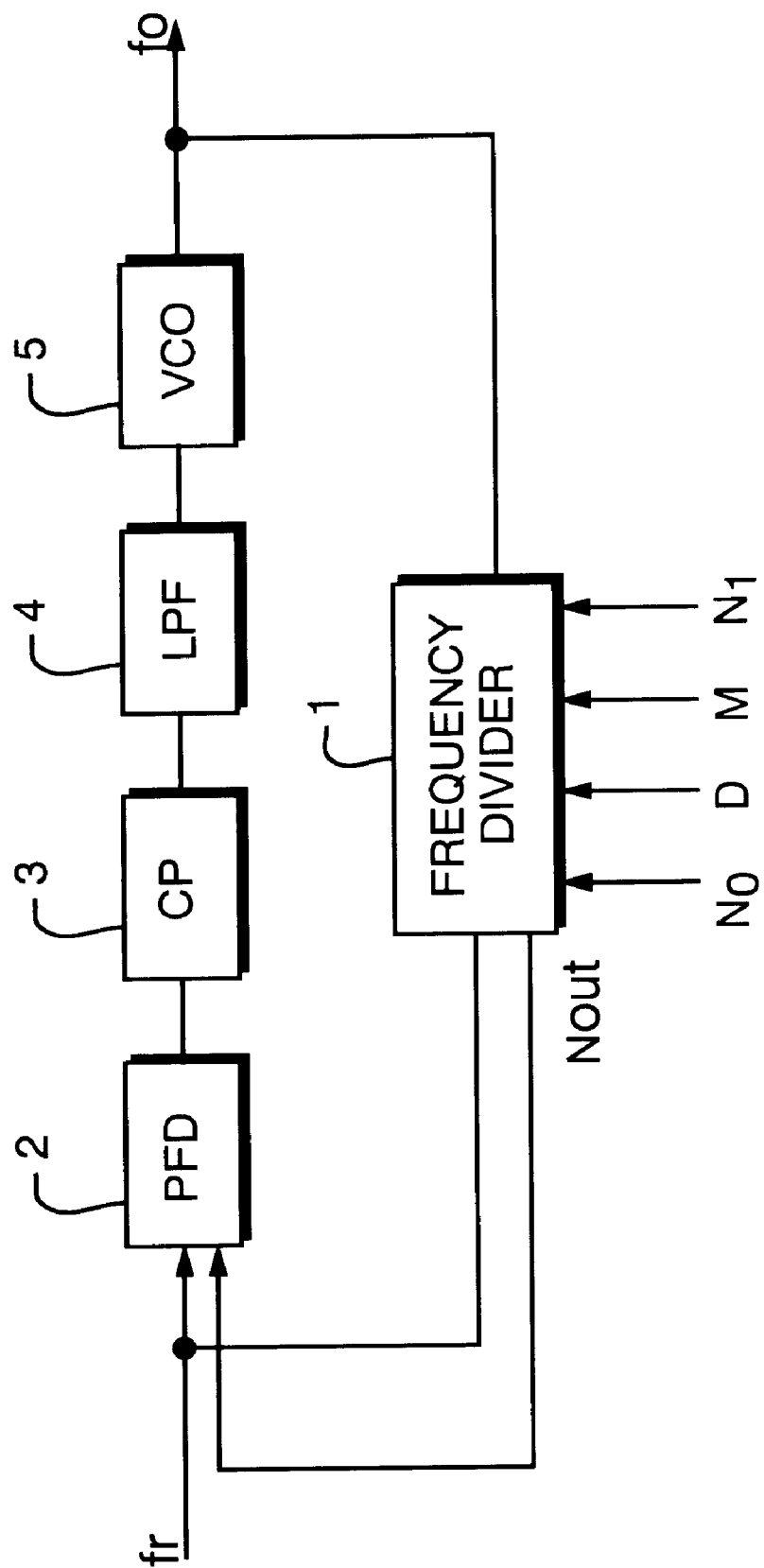
FIG. 3 is a block diagram showing the phase-locked loop circuit according to an embodiment of the present invention.
Figure 4:
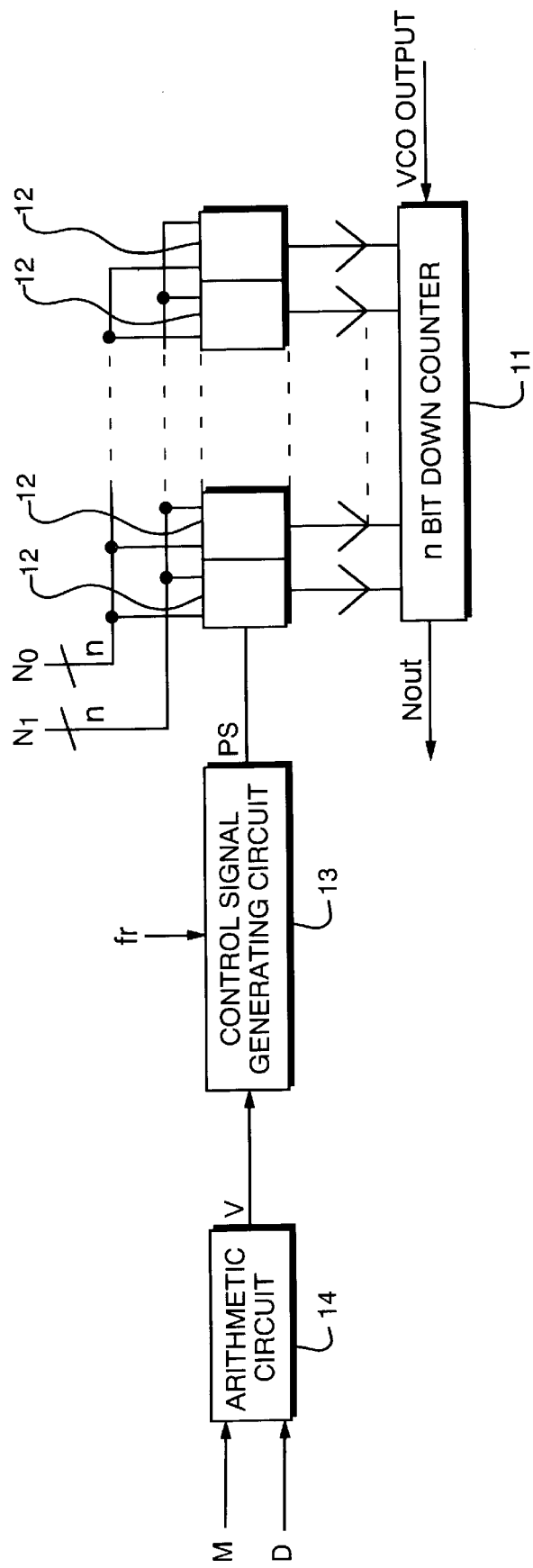
FIG. 4 is a block diagram showing a counter, multiplexers, control signal generating circuit, and arithmetic circuit of an embodiment of the frequency divider of FIG. 3.

Hereinafter, the phase-locked loop circuit according to an embodiment of the present invention will be described in detail with reference to the accompanying drawings. Like conventional PLL circuits, the present embodiment suppresses EMI problems by outputting oscillation frequencies of triangular waveform. FIG. 3 is a block diagram showing the phase-locked loop (PLL) circuit according to the embodiment of the present invention. FIG. 4 is a block diagram showing a counter, multiplexers, control signal generating circuit, and arithmetic circuit of an embodiment of the frequency divider of FIG. 3.

The PLL circuit according to the present embodiment comprises a phase and frequency detector (PFD) 2, a charge pump (CP) 3, a low-pass filter (LPF) 4, and a voltage-controlled oscillator (VCO) 5 in series connection. Besides, a frequency divider 1 for frequency-dividing signals output from the voltage-controlled oscillator 5 is connected to an input terminal of the phase and frequency detector 2. A loop circuit has such configuration. The phase and frequency detector 2 makes a comparison in phase between a reference frequency $f_r$ and the frequency of an output pulse of the frequency divider 1, and outputs the phase difference to the charge pump 3. The charge pump 3 charges/discharges the capacitor provided in the low-pass filter 4 in accordance with the signal from the phase and frequency detector 2. The low-pass filter 4 separates the input signal input for transmission. The voltage-controlled oscillator 5 oscillates pulse signals in association with a change in the output voltage from the low-pass filter 4.

Referring to FIG. 4, the frequency divider 1 is provided with an n-bit down counter 11 for outputting a pulse upon receiving n of pulse inputs output from the voltage-controlled oscillator 5. This n-bit down counter 11 is connected with n of multiplexers 12 to which two types of n-bit dividing factors $N_0$ and $N_1$ are input. There is also provided a control signal generating circuit 13 to which reference frequency $f_r$ is input. The circuit 13 generates a control signal PS for the multiplexers 12. For example, when the control signal PS is "0", the multiplexers 12 output the dividing factor $N_0$ to the n-bit down counter 11. When the control signal is "1", the multiplexers 12 output the dividing factor $N_1$ to the n-bit down counter 11. The difference between the dividing factor $N_0$ and the dividing factor $N_1$ is not particularly limited in value; it may be 1 or 2, or may take any other value.

Moreover, the control signal generating circuit 13 is connected with an arithmetic circuit 14 for calculating and outputting an integer value V for use in determining the control signal PS. To the arithmetic circuit 14 are input a modulation scaling signal D for determining the difference between the maximum frequency and the minimum frequency of the oscillated frequency forming a triangular wave, and a modulation frequency signal M for determining the frequency of the triangular wave. Incidentally, the modulation scaling signal D and the modulation frequency signal M are not particularly limited in the number of bits. The n-bit down counter 11, the multiplexers 12, the control signal generating circuit 13, and the arithmetic circuit 14 constitute the dividing factor switching circuit.

Next, description will be made on the relation between the integer value V and the control signal PS. FIGS. 5A through 5D are schematic diagrams showing the relation between the integer value V and the control signal PS.

Figure 5:
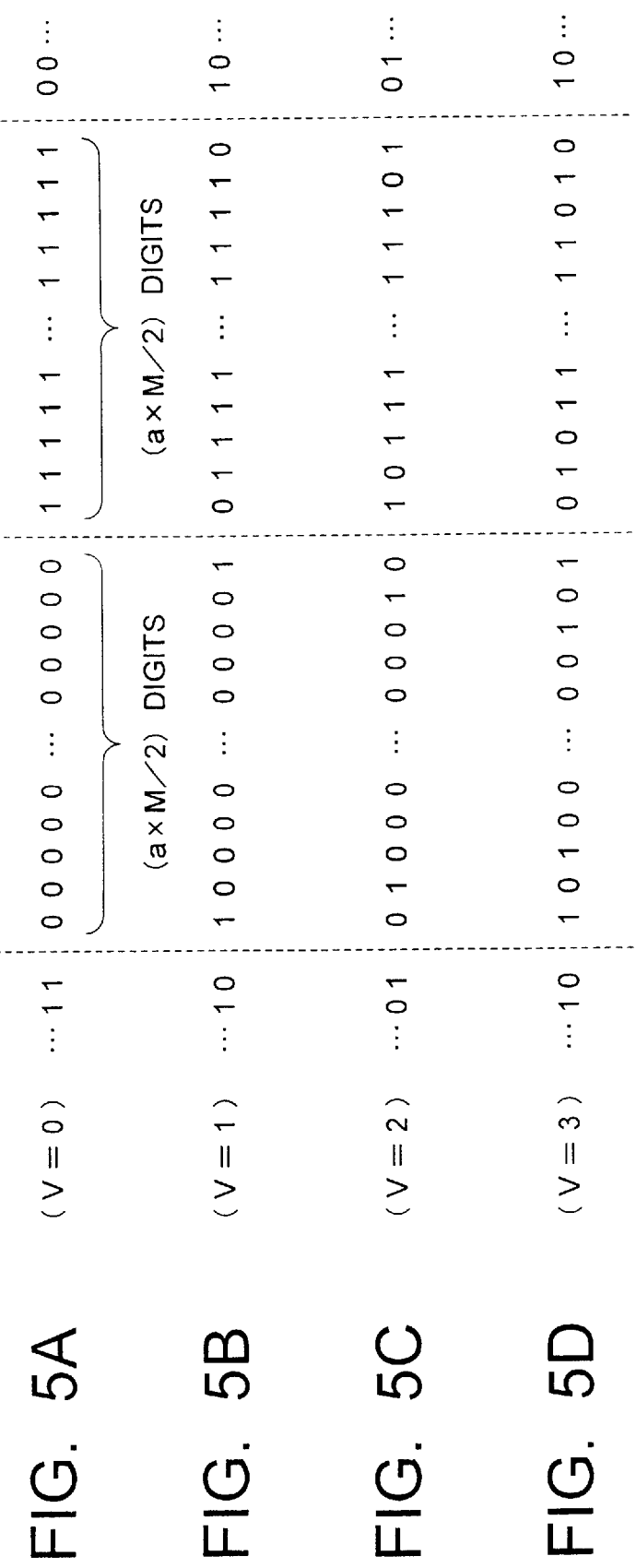
FIGS. 5A through 5D are schematic diagrams showing the elation between an integer value V and a control signal PS.

When the integer value V is "0", as shown in FIG. 5A, the control signal PS has series of (a×M/2) digits of 0s and series of (a×M/2) digits of 1s arranged alternately. Here, a is an arbitrary positive even number. The resultant triangular waveform has a period of (a×M/$f_r$). For example, the value a=4 can combine with a fourth the clock number M to obtain a triangular waveform having the same period as in the case where the value a=1.

When the integer value V is "1", as shown in FIG. 5B, the control signal PS has an arrangement that a single-digit exchange is made across each boundary between the series of 0s and the series of 1s in FIG. 5A.

When the integer value V is "2", as shown in FIG. 5C, the control signal PS has an arrangement that a two-digit exchange is made on the arrangement of FIG. 5B across each boundary between the series of 0s and the series of 1s in FIG. 5A.

Correspondingly, when the integer value V is "3", as shown in FIG. 5D, the control signal PS has an arrangement that a three-digit exchange is made on the arrangement of FIG. 5C across each boundary between the series of 0s and the series of 1s in FIG. 5A.

When the integer value V is "4", or greater, the control signal PS follows the above-described rule to have an arrangement that the 0s and 1s as many as the integer value V are exchanged across each boundary between the series of 0s and the series of 1s in FIG. 5A.

Here, the value of the integer value V is determined in association with the modulation frequency signal M so as to obtain a triangular wave. The modulation scaling signal D is used to deliberately change the value of the integer value V to change the frequency range.

Figure 6:
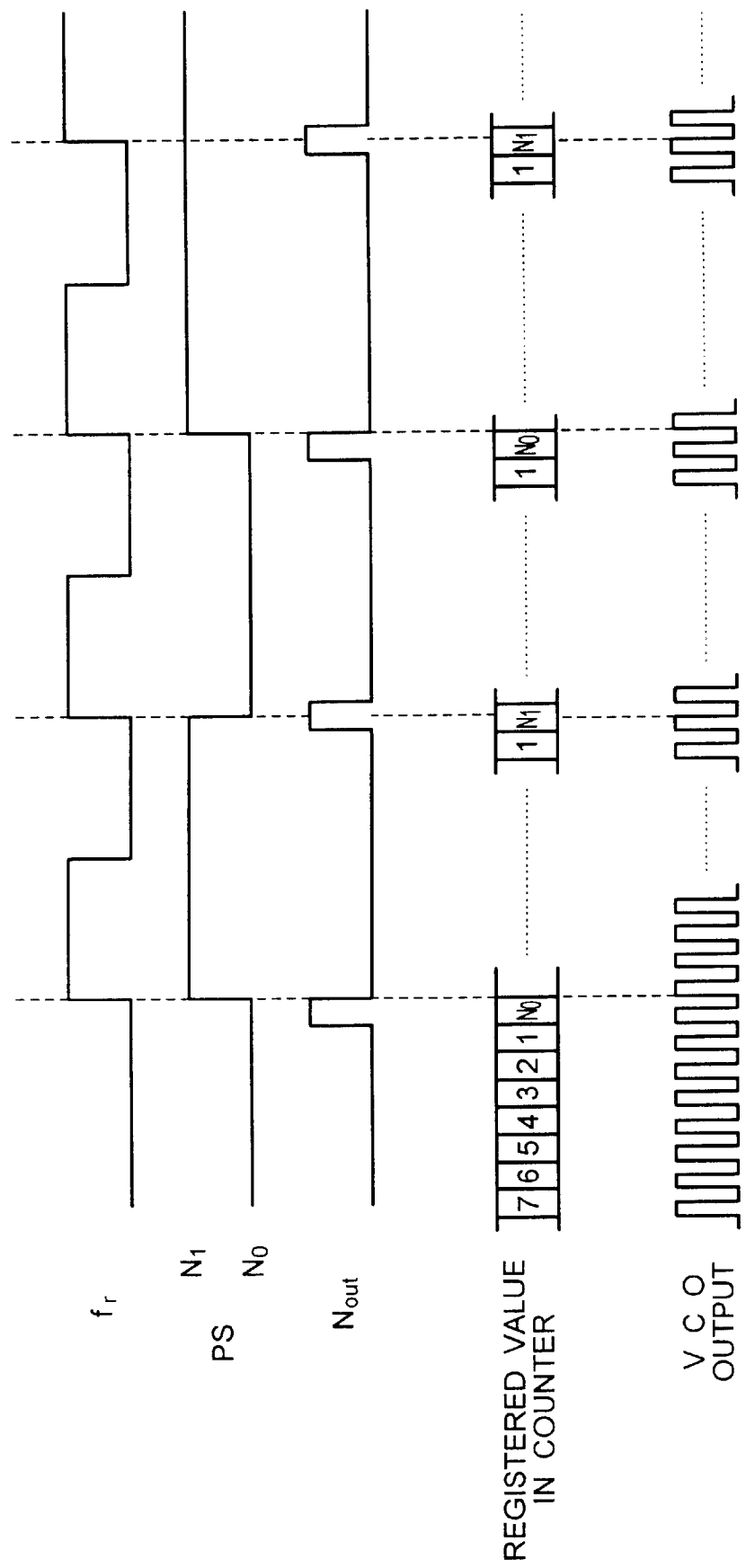
FIG. 6 is a timing chart for explaining the operation the frequency divider 1.

Next, description will be given of the operation of the frequency divider 1. FIG. 6 is a timing chart for explaining the operation of the frequency divider 1. Here, the description will be made as to a time domain in which the integer value V is determined in association with the modulation scaling signal D and modulation frequency signal M so that the control signal PS varies like . . . , 0, 1, 0, 1, 1 . . .

When the control signal PS is "0", the n-bit down counter 11 counts $N_1$ until it outputs a pulse $N_{out}$. The reference frequency $f_r$ is input to the control signal generating circuit 13, which in turn outputs the control signal PS=1 to the multiplexers 12. On the occasion when the control signal PS varies from "0" to "1", the multiplexers 12 output the dividing factor $N_0$ to the n-bit down counter 11, and the n-bit down counter 11 starts to count $N_0$ of output pulses.

Subsequently, upon counting $N_0$ of the output pulses from the voltage-controlled oscillator 5, the n-bit down counter 11 outputs a pulse $N_{out}$. Next, the control signal generating circuit 13 changes the control signal PS from "1" to "0", and outputs this control signal PS to the multiplexers 12. The multiplexers 12 output the dividing factor $N_1$ to the n-bit down counter 11, and the n-bit down counter 11 starts to count $N_1$ of output pulses.

Such steps will be repeated.

Figure 7:
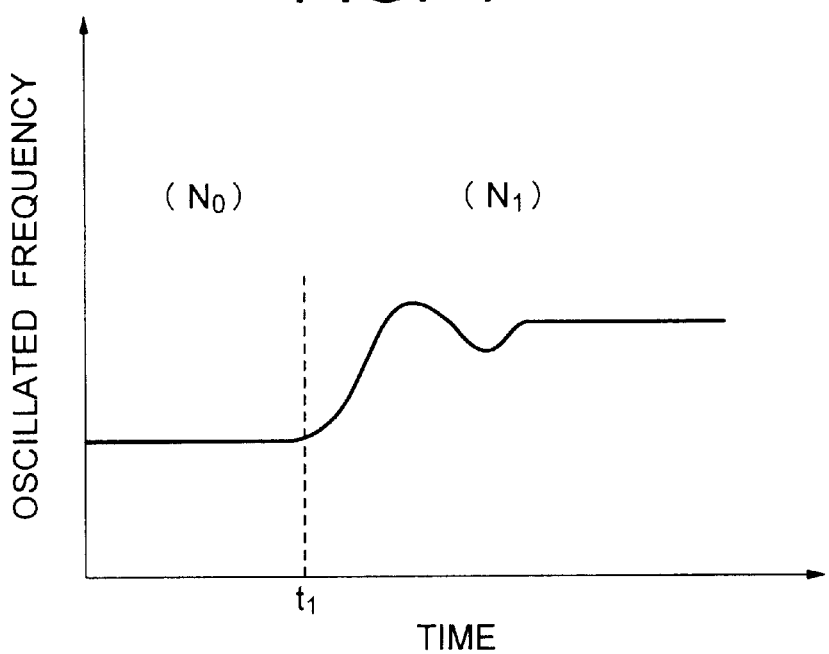
FIG. 7 is a graphical representation schematically showing variation in oscillated frequency in a PLL circuit.

Now, description will be given of the operation of the PLL circuit according to the present embodiment. FIG. 7 is a graphical representation on which the abscissa represents time and the ordinate represents oscillated frequency, schematically showing variation in the oscillated frequency in a PLL circuit. Generally, in the case where the phase of the oscillated frequency in a PLL circuit is already locked with the dividing factor $N_0$=m and the dividing factor is then changed to $N_1$=m+1 at a time $t_1$, the phase takes a certain period of time to be locked to the phase corresponding to the dividing factor $N_1$=m+1. Here, like the phase, the oscillated frequency itself also takes a certain period of time to coincide with the frequency for the dividing factor $N_1$=m+1. Accordingly, if the dividing factor is switched between $N_0$ and $N_1$ before the phase of the oscillated frequency is locked to the phase corresponding to the dividing factor $N_1$=m+1, i.e., in its transition, the phase of the oscillated frequency will take up more time to be locked to the phase for the dividing factor $N_1$=m+1.

In the present embodiment, the dividing factor is switched before the phase lock of the oscillated frequency, by means of the control signal PS based on the integer value V. On this account, the phase of the oscillated frequency is free from lock, and the oscillated frequency varies in certain periods.

Figure 8:
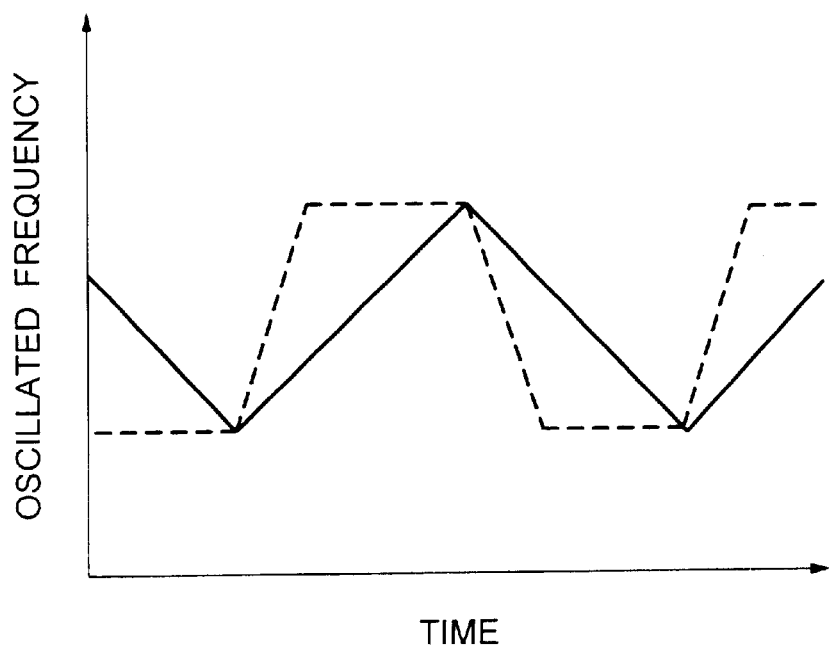
FIG. 8 is a graphical representation schematically showing variation in oscillated frequency with the dividing factor changed.

FIG. 8 is a graphical representation on which the abscissa represents time and the ordinate represents oscillated frequency, schematically showing variation in the oscillated frequency produced by a change in the dividing factor. In FIG. 8, the full line represents the frequency with time domains in which the dividing factors $N_0$ and $N_1$ alternate with each other, and the broken line represents the frequency with the time domains in each of which the dividing factor $N_0$ or $N_1$ simply continues to serve. As shown in FIG. 8, in the case where the dividing factor $N_0$ and the dividing factor $N_1$ are kept unchanged throughout a time domain, the phase gets locked and the oscillated frequency reaches saturation somewhat after the change of the dividing factors. In contrast, the oscillated frequency with time domains in which the dividing factors $N_0$ and $N_1$ alternate with each other exhibits more gentle ascents and descents as compared with the former case, and the oscillated frequency starts to vary in an opposite direction as soon as it reaches a former saturation value. As a result, a triangular waveform is obtained in the latter case.

The oscillated frequency forming a triangular waveform without saturation provides effective EMI suppression, whereas the oscillated frequency reaching saturation can only suppress EMI insufficiently.

The time needed for the lock to follow a change in the dividing factor is characterized by charge-pump current Ip, VCO gain K of the voltage-controlled oscillator, and impedance $Z_f$ of the low-pass filter. In the present embodiment, it is preferable that the oscillated frequency makes more gentle ascents and descents than those of conventional PLL circuits for multiplication; therefore, the lock time is preferably longer and the bandwidth preferably wider.

If the modulation scaling signal D is fixed, the triangular waveform is also fixed to the maximum value of $(f_r \times N_1)$ and the minimum value of $(f_r \times N_0)$ even when the other conditions are changed. This means that the modulation scaling signal D can be changed to narrow the gap between the maximum value and the minimum value for narrower ranges.

In the embodiment described above, there is provided a period in which the control signal PS has "01"s or "10"s in a row. However, the present invention is not limited thereto, and the same effect as that of the present embodiment can be obtained by providing a period having "001"s, "101"s, or the like in a row or a period having an irregular series of 0s and is between the period having a series of 0s and the period having a series of is so that the oscillated frequency forms a triangular waveform without saturation.

Hereinafter, concrete description will be made on the results of the simulation run on the embodiment of the present invention.

Figure 9:
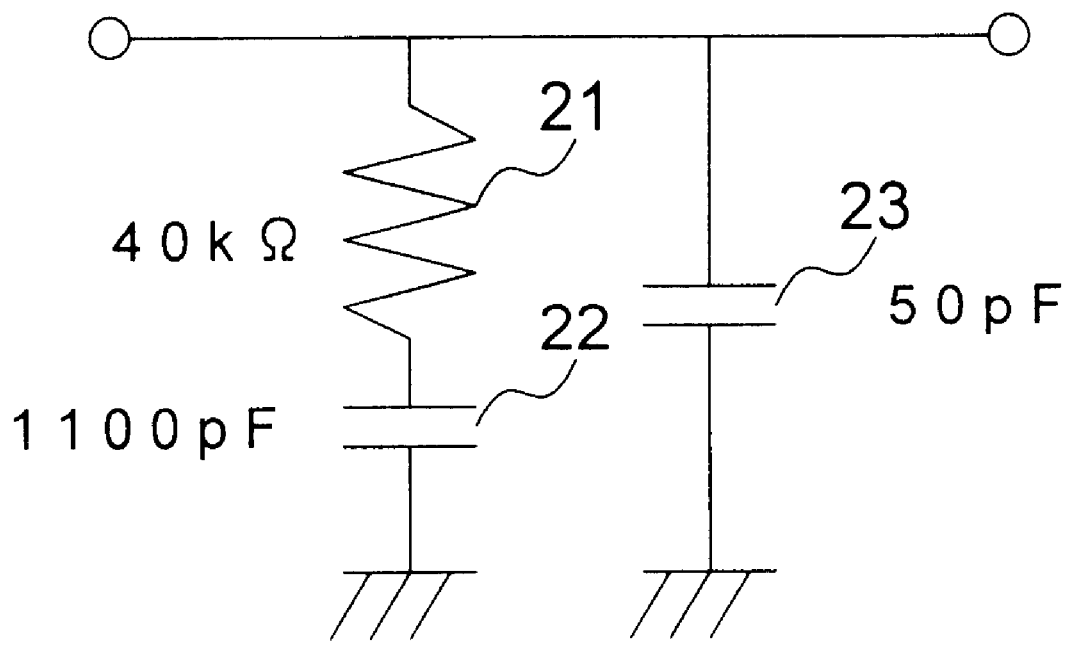
FIG. 9 is a circuit diagram showing the configuration of the low-pass filter used in simulations.

The simulation was made with a charge-pump current Ip of 6 μA, a VCO gain K of 115 MHz/V, the dividing factor $N_0$ of 90, and the dividing factor $N_1$ of 91. FIG. 9 is a circuit diagram showing the configuration of the low-pass filter used in the simulation. The low-pass filter was composed of a resistor 21 of 40 kΩ and a capacitor 22 of 1100 pF in series connection with each other, and a capacitor 23 of 50 pF connected thereto in parallel. Moreover, the clock number M of the reference frequency included in one cycle of the triangular wave was 11, the value of a was 4, and the reference frequency $f_r$ was 2.182 MHz.

Figure 10:
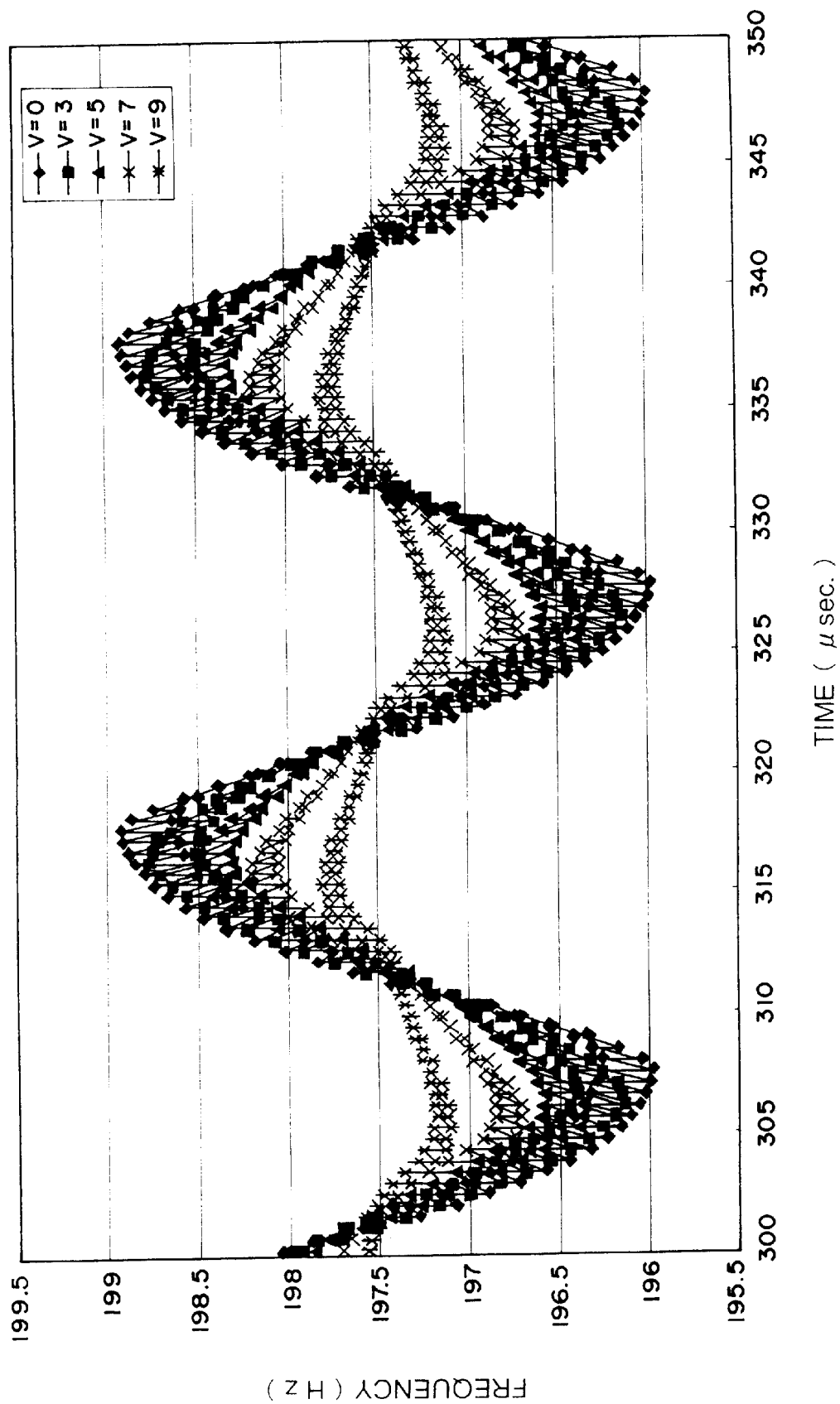
FIG. 10 is a graphical representation showing the simulation results on oscillated frequency.

FIG. 10 is a graphical representation on which the abscissa represents time and the ordinate represents oscillated frequency, showing the results of the simulation. It is seen from FIG. 10 that when the integer value V according to the embodiment was 3, 5, 7, or 9, the oscillated frequency did not reach saturation, and a triangular waveform could be obtained. In contrast, when the integer value V according to a comparative example was "0", the oscillated frequency was temporarily locked to the dividing factor $N_0$ or $N_1$ with saturation, approaching a rectangular waveform rather than a triangular waveform.

As has been described in detail, according to the present invention, the provision of the dividing factor switching circuit for switching the dividing factor before the phase of the pulse signal is locked to that of the reference clock signal allows more gentle changes in the oscillated frequency as compared with the case where the dividing factor is not switched until after the lock. Accordingly, the oscillated frequency can be increased or decreased before saturation. This makes it possible to obtain a so-called triangular waveform and suppress EMI without the use of storage device such as ROM. Moreover, due to the absence of ROM, the modulation conditions can be modified easily by supplying the external signals to the dividing factor switching circuit to change the internal signals.

While there has been described what is at present considered to be a preferred embodiment of the invention, it will be understood that various modifications may be made thereto, and it is intended that the appended claims cover all such modifications as fall within the true spirit and scope of the invention.

What is claimed is:

1. A phase-locked loop circuit comprising:

an oscillator which outputs a pulse signal; and a frequency divider for frequency-dividing said pulse signal, said frequency divider having a dividing factor switching circuit which switches a dividing factor before a phase of said pulse signal is locked to that of a reference clock signal, said dividing factor switching circuit including a first input signal that is a modulation frequency signal used in determining a frequency of a waveform, a second input signal that is a modulation scaling signal to determine a frequency range for said waveform, wherein a control signal for switching said dividing factor is determined in accordance with said first input signal and said second input signal, and wherein said dividing factor switching circuit periodically switches dividing factors using said modulation frequency signal and said modulation scaling signal to prevent a phase of said pulse signal from being locked, said dividing factor switching circuit further comprising:

a multiplexer which selects one dividing factor from among two or more dividing factors supplied thereto;

a control signal generating circuit which generates said control signal for controlling an order of dividing-factor selection in said multiplexer association with a frequency of said reference clock signal; and a counter which generates an output signal upon receiving a member of pulses of said pulse signal from said oscillator, the number corresponding to the dividing factor selected by said multiplexer.

2. The phase-locked loop circuit according to claim 1, wherein said control signal causes said multiplexer to continuously select only a first dividing factor throughout a first period, continuously select only a second dividing factor throughout a second period, and continuously select said first dividing factor and said second dividing factor in a combination in a third period provided between said first period and said second period.

3. The phase-locked loop circuit according to claim 2, wherein said control signal causes said multiplexer to alternately select said first dividing factor and said second dividing factor in said third period.

4. A frequency modulation method for switching a dividing factor before a phase of a pulse signal output from an oscillator is locked to that of a reference clock signal, the method comprising:

producing a pulse signal;

producing a control signal in accordance with a first input signal and a second input signal, said first input signal being a modulation frequency signal used in determining a frequency of a waveform, said second input signal being a modulation scaling signal to determine a frequency range for said waveform;

periodically switching a dividing factor using said control signal to prevent a phase of said pulse signal from being locked;

prior to switching the dividing factor, fixing said dividing factor to a first dividing factor before the phase of said pulse signal is locked to that of said reference clock signal;

subsequent to switching the dividing factor, fixing said dividing factor to a second dividing factor before the phase of said pulse signal is locked to that of said reference clock signal; and said switching a dividing factor includes switching said dividing factor to said first dividing factor and said second dividing factor in a combination.

5. The frequency modulation method according to claim 4, wherein switching the dividing factor includes:

switching said dividing factor to said first dividing factor and said second dividing factor in turns.

6. The frequency modulation method according to claim 5, further comprising changing the frequency of said pulse signal stepwise, wherein said changing the frequency of said pulse signal stepwise further comprises:

fixing said dividing factor to said first dividing factor;

switching said dividing factor;

fixing said dividing factor to said second dividing factor; and switching said dividing factor.

7. The frequency modulation method according to claim 4, further comprising changing the frequency of said pulse signal stepwise, wherein said changing the frequency of said pulse signal stepwise further comprises repeating:

fixing said dividing factor to said first dividing factor;

switching said dividing factor;

fixing said dividing factor to said second dividing factor; and switching said dividing factor.

8. A phase-locked loop circuit comprising:

an oscillator generating a pulse signal; and a frequency divider including as inputs a plurality of dividing factors, a modulation frequency signal for determining the frequency of a triangular waveform, and a modulation scaling signal for determining a difference between a minimum and a maximum frequency of an oscillating frequency forming the triangular waveform, wherein the frequency divider further including:

an arithmetic circuit including as inputs said modulation scaling signal and said modulation frequency signal and producing as an output signal an integer value, said integer value being determined in accordance with said inputs to said arithmetic circuit;

a control signal generating circuit including as inputs said integer value and a reference frequency and producing as an output a control signal used to select one of said plurality of dividing factors, a selected dividing factor; and a counter including as inputs said selected dividing factor and said pulse signal and generating an output signal upon receiving a predetermined number of pulses of said pulse signal, said predetermined number being said selected dividing factor.

9. The phase-locked loop circuit of claim 8, further comprising:

a phase and frequency detector having as inputs said reference frequency and a frequency divider output signal representing a phase difference between said reference frequency and said output signal of said counter;

a charge pump connected to said phase and frequency detector for charging and discharging a capacitor in accordance with an output of said phase and frequency detector; and a low pass filter connected to said charge pump and including said capacitor, said low pass filter separating a transmission input signal.

* * * * *